United States Patent
Chunn et al.

(10) Patent No.: US 9,280,419 B2
(45) Date of Patent: Mar. 8, 2016

(54) DYNAMIC ADJUSTMENT OF DATA PROTECTION SCHEMES IN FLASH STORAGE SYSTEMS BASED ON TEMPERATURE, POWER OFF DURATION AND FLASH AGE

(71) Applicant: International Business Machines Corporation, Armonk, NY (US)

(72) Inventors: Adam C. Chunn, Houston, TX (US); Franck Excoffier, Katy, TX (US); Aaron D. Fry, Richmond, TX (US); Lincoln T. Simmons, Houston, TX (US); Gary A. Tressler, Sandy Hook, CT (US); Andrew D. Walls, Santa Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 165 days.

(21) Appl. No.: 14/107,890

(22) Filed: Dec. 16, 2013

(65) Prior Publication Data

US 2015/0169398 A1    Jun. 18, 2015

(51) Int. Cl.
*G11C 29/00* (2006.01)
*G06F 11/10* (2006.01)
*H03M 13/35* (2006.01)

(52) U.S. Cl.
CPC ........... *G06F 11/106* (2013.01); *H03M 13/353* (2013.01)

(58) Field of Classification Search
CPC .............................. H03M 13/05; G06F 11/10
USPC .................................................. 714/763, 774
See application file for complete search history.

(56) References Cited

U.S. PATENT DOCUMENTS

2008/0270639 A1    10/2008    Elhamias et al.
2009/0070612 A1    3/2009    Adelman et al.
(Continued)

FOREIGN PATENT DOCUMENTS

WO    2009042298 A1    4/2009
WO    2012058328 A1    5/2012

OTHER PUBLICATIONS

Aritome, Seiichi et al.; "Reliability Issues of Flash Memory Cells," Proceeding of the IEEE, vol. 81, No. 5, May 1993, pp. 776-788.
Dutta, Prabal et al.; "Procrastination Might Lead to a Longer and More Useful Life," 6th Workshop on Hot Topics in Networks (HotNets VI) 2007, pp. 1-7.
(Continued)

*Primary Examiner* — Guy Lamarre
(74) *Attorney, Agent, or Firm* — Cantor Colburn LLP; Randall Bluestone

(57) ABSTRACT

A data retention methodology for use in electrically rewritable nonvolatile storage systems is disclosed. The methodology collects characterization data of the storage system (e.g., time stamps, program/erase cycles, sensed temperature over time, and others) and uses at least a portion of that data to associate various data retention schemes with the collected characterization data. At power-on, the methodology determines a duration of a time during which power was not supplied to the storage system. The methodology also uses the power-on time to trigger the selection of an appropriate data protection scheme (e.g., enhanced ECC and/or read/scrub frequency). Dynamic selection and adjustment of the applied protection scheme may be based on the predetermined and/or calculated association between various protection schemes and the collected characterization data of the storage system.

20 Claims, 6 Drawing Sheets

(56) References Cited

U.S. PATENT DOCUMENTS

| | | |
|---|---|---|
| 2011/0099418 A1* | 4/2011 | Chen .................... 714/6.24 |
| 2011/0185224 A1 | 7/2011 | Tsai et al. |
| 2012/0026791 A1 | 2/2012 | Li |
| 2012/0151260 A1 | 6/2012 | Zimmermann et al. |
| 2012/0216938 A1 | 8/2012 | Johnson et al. |
| 2012/0239631 A1 | 9/2012 | Nagpal et al. |
| 2012/0284575 A1 | 11/2012 | Foley |

OTHER PUBLICATIONS

Gutmann, Peter; "Data Remanence in Semiconductor Devices," Proceedings of the 10th Conference on USENIX Security Symposium, SSYM'01, vol. 10, 2001, pp. 1-19.

Jiang, Anxiao et al.; "Error Scrubbing Codes for Flash Memories," IEEE, 2009, pp. 32-35.

Wei, Michael et al.; "Reliably Erasing Data From Flash-Based Solid State Drives," FAST'11, Proceedings of the 9th USENIX Conference on File and Storage Technologies, 2011, pp. 1-13.

* cited by examiner

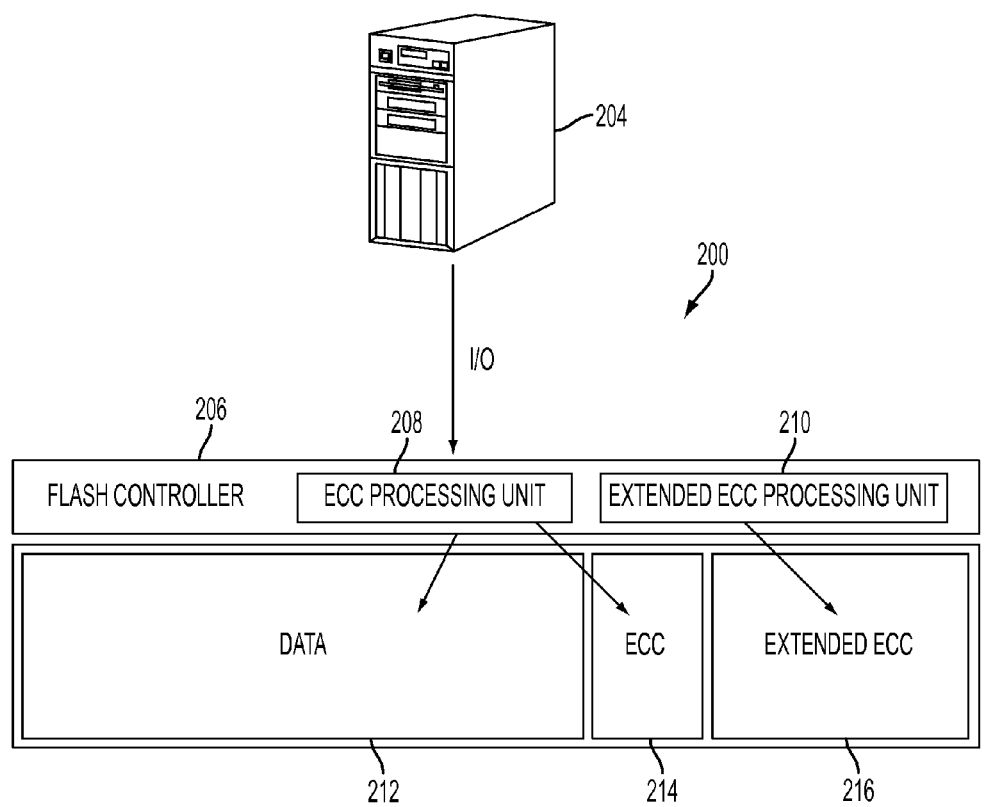

| POWER OUTAGE DURATION (HOURS) | MINIMUM FLASH ENDURANCE REMAINING (% OF PROGRAM-ERASE CYCLE SPECIFICATION) | ENHANCED ECC SCHEME APPLIED (CORRECTION STRENGTH) |
|---|---|---|
| A | W | 1 |
| A | X | 2 |
| A | Y | 3 |
| A | Z | 4 |
| B | W | 2 |
| B | X | 2 |
| B | Y | 3 |
| B | Z | 4 |
| C | W | 2 |
| C | X | 3 |
| C | Y | 3 |
| C | Z | 4 |
| D | W | 3 |
| D | X | 4 |
| D | Y | 4 |
| D | Z | 4 |
| A<B<C<D | W>X>Y>Z | 1<2<3<4 |

FIG. 6A

| READ SCRUB FREQUENCY (RATE) | AVERAGE TEMPERATURE (DEGREES C) |
|---|---|
| 1 | A |
| 2 | B |
| 3 | C |
| 4 | D |
| 1<2<3<4 | A<B<C<D |

FIG. 6B

DYNAMIC ADJUSTMENT OF DATA PROTECTION SCHEMES IN FLASH STORAGE SYSTEMS BASED ON TEMPERATURE, POWER OFF DURATION AND FLASH AGE

BACKGROUND

The disclosed embodiments relate in general to data protection schemes in storage systems. More specifically, the disclosed embodiments relate to optimizing the selection and application of appropriate levels of data protection in an electrically rewritable nonvolatile storage system by dynamically adjusting a data scrub frequency and/or an error correcting code (ECC) scheme applied to the storage system.

Flash memory, which has no moving parts, is a type of nonvolatile storage system that can be erased and reprogrammed in units of memory often referred to as pages or blocks. Flash memory gets its name because entire sections of memory can be erased in a single action or "flash. An array of flash memories can transfer data to and from solid state drives (SSDs) much faster than electromechanical disk drives.

Because it lacks moving parts, flash memory technology is well suited for embarked systems such as airplane applications. However in such an environment, devices might stay powered off for an extended period of time. This can become a problem with flash memory due to limits on its ability to retain data in high temperature environments or over extended periods of time without power. Thus, the rate at which bit errors within flash memory cells increase is a function of the system temperature and the age of the flash block measured in program/erase (P/E) cycles.

Known approaches to addressing bit errors within flash memory cells include the flash storage controller periodically issuing a memory "scrub" read to the flash cells that are estimated to be at risk. A relatively simple background task may be run on the flash controller's CPU and iterated over all valid RAID (redundant array of independent disks) stripes issuing a flash read to each page. RAID is a way of storing the same data in different places (thus, redundantly) on multiple hard disks. By placing data on multiple disks, I/O (input/output) operations can overlap in a balanced way, improving performance. Using the aforementioned background task, the flash controller periodically scrubs and checks all user data for bit errors no matter how frequently or infrequently the host application accessed the data. If a system is powered off and shelved for an extended period of time, the flash controller itself would have no concept of how urgently a scrub of all physical data was needed.

ECC is another known approach to addressing bit errors. However, the effectiveness of ECC schemes depends heavily on how much correction data is stored. Also, applying more robust ECC schemes can reduce overall system performance. Therefore, the appropriate ECC scheme/level for a particular flash based storage subsystem is heavily dependent on the type of flash and the application needs. In the case of an embarked system designed to sit idle for a long period of time in a hot environment (e.g., in a desert), performance must be sacrificed to allow for a more robust level of ECC scheme. Hence, known ECC algorithms require a design tradeoff between high recovery capacity and reduced overall I/O performance.

SUMMARY

The disclosed embodiments include a computer implemented method of selecting data protection for a storage device, the method comprising: storing data in the storage device; determining a data protection scheme based on characterization data of the storage device and at least one measured parameter; and applying the data protection scheme to the data.

The disclosed embodiments further include a system for selecting data protection for a storage device, the system comprising: a computer system having a processor, the computer system configured to perform a method comprising: storing data in the storage device; determining a data protection scheme based on characterization data of the storage device and at least one measured parameter; and applying the data protection scheme to the data.

The disclosed embodiments may further include the above-described system wherein: the storage device comprises a specific type of storage device; and the characterization data comprises performance data developed from testing said specific type of storage device as part of a design process of a storage system. The disclosed embodiments may include the above-described system further comprising using a look-up table that associates various data protection schemes with the characterization data to determine the data protection scheme.

BRIEF DESCRIPTION OF THE SEVERAL VIEWS OF THE DRAWINGS

FIG. 1 is a chart illustrating a hypothetical example of the rated data retention time in days of a hypothetical flash storage system based on temperature and program/erase cycles of the flash storage system.

FIG. 2 is a diagram illustrating an example of a configuration of a computer that performs a methodology according to the disclosed embodiments.

FIG. 6a is a diagram illustrating an example of a table that may be used to dynamically adjust a data protection scheme for a storage system in accordance with the disclosed embodiments.

FIG. 6b is a diagram illustrating another example of a table that may be used to dynamically adjust a data protection scheme for a storage system in accordance with the disclosed embodiments.

Figure 3:
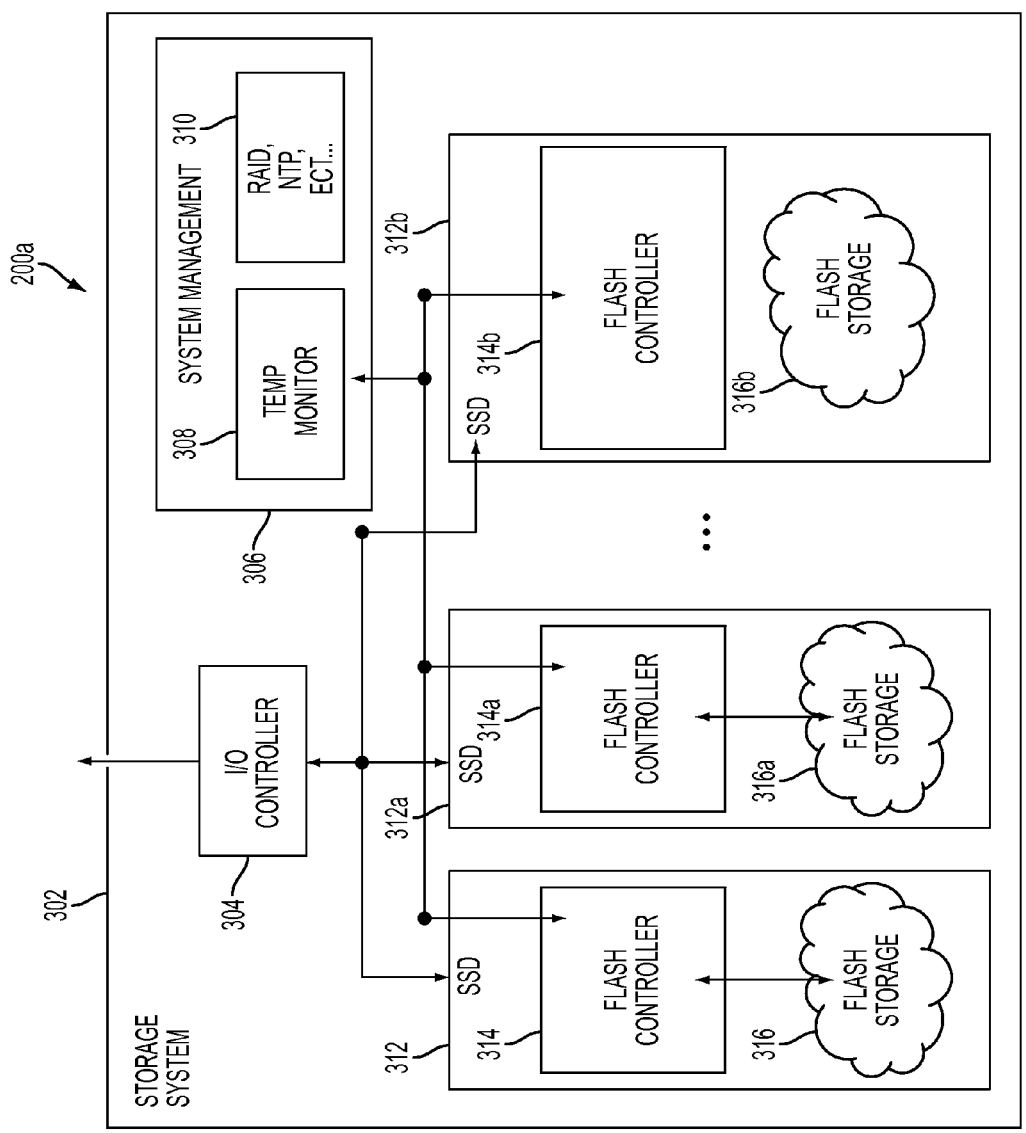
FIG. 3 is a diagram illustrating another example of a configuration of a computer that performs a methodology according to the disclosed embodiments.

In the accompanying figures and following detailed description of the disclosed embodiments, the various elements illustrated in the figures are provided with three-digit reference numbers. The leftmost digit of each reference number corresponds to the figure in which its element is first illustrated.

DETAILED DESCRIPTION

Various embodiments of the present disclosure will now be described with reference to the related drawings. Alternate embodiments may be devised without departing from the scope of this disclosure. Additionally, well-known elements of the disclosed embodiments will not be described in detail or will be omitted so as not to obscure the relevant details of the disclosure.

FIG. 1 is a chart 100 illustrating a hypothetical example of the rated data retention time in days of a hypothetical flash storage system based on temperature and program/erase (P/E) cycles of the flash storage system. The left and center columns of chart 100 list temperature values in Fahrenheit and Celsius. The heading of the rightmost column shows the age of the flash storage expressed in P/E cycles (shown as 30K P/E cycles). The empirical data retention lifetime (in days) is shown in the block underneath the rightmost column heading. As shown in FIG. 1, where the temperature is 80 degrees F. and the flash memory has performed 30K P/E cycles, the chart tells us that the hypothetical flash memory should retain its data for only a maximum of 406 days without power being applied to the storage system. However, because of a variety of factors, the performance of an actual flash storage system may deviate significantly from the performance predicted by its rating data.

Because many applications leave stored data on the shelf and removed from power for extended periods of time, conventional flash storage systems implement some form of data protection scheme at power-on. The disclosed embodiments provide several methodologies and schemes for dynamically selecting and/or adjusting a data protection scheme in storage systems at power-on. More specifically, the disclosed embodiments provide reliable data protection in an electrically rewritable nonvolatile storage system (e.g., NAND NVRAM) by dynamically adjusting a data scrub frequency and/or an error correcting code ECC scheme applied to the storage system at power-on. According to the disclosed embodiments, upon power outage/loss, a read scrub process is engaged immediately upon restoration of power. An enhanced ECC scheme is applied to the initial scrub after power loss based on a duration of the power outage and the number of program/erase cycles to protect against potential lost capacity that may be induced by an increased level of block retirement if the original, reduced ECC capability is applied. The appropriate level of enhanced ECC applied upon power up is determined based on an input matrix (e.g., tables 600 and 600a shown in FIGS. 6a and 6b and described later in this disclosure) established from device characterization results. In contrast to chart 100 of FIG. 1, tables 600, 600a are developed from characterization data developed from representative samples of actual flash storage systems used in the flash system design.

Further according to the disclosed embodiments, for a read scrub process that is engaged upon restoration of power, the duration of the power loss and the number of program/erase cycles can be determined. A worst case temperature may be assumed, or alternatively the actual temperature in place during the power loss/outage may be determined from a temperature sensor. The temperature, either assumed or measured, may be taken in conjunction with the duration of the power loss (calculated from real time time stamps available in the overall system at power-on and power-off) and the number of program/erase cycles to assign an optimized and effective read scrub frequency. By using the above-described temperature sensor, an actual average temperature can be determined for the power loss duration, and as a result an optimized read scrub frequency that has a less negative impact on performance can be selected. The selection of an optimized and appropriate read scrub frequency vs. average temperature can be determined from an input matrix established from device characterization results. Examples of input matrices according to the disclosed embodiments are shown in FIGS. 6a and 6b and described in more detail later in this disclosure.

Figure 4:
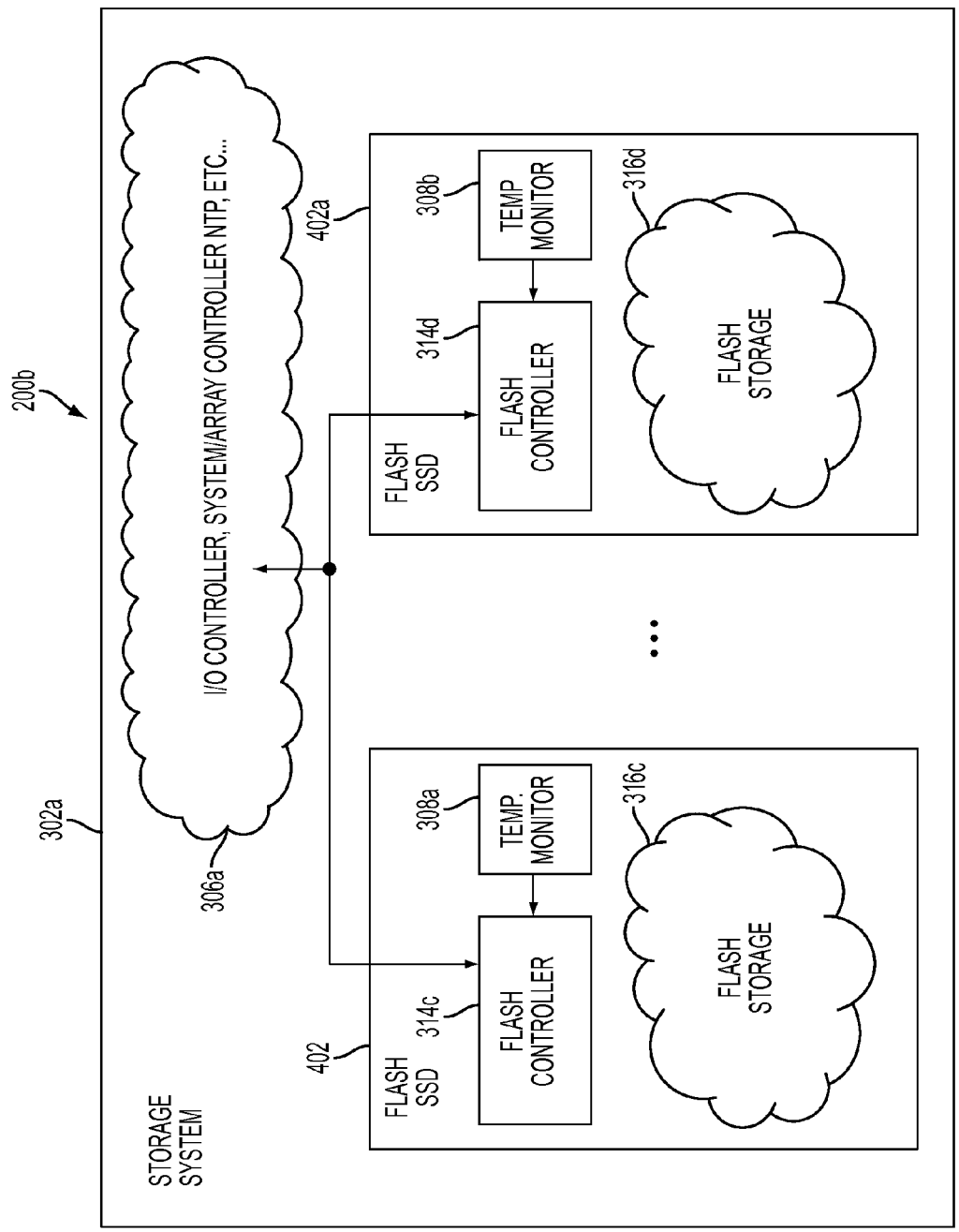
FIG. 4 is a diagram illustrating another example of a configuration of a computer that performs a methodology according to the disclosed embodiments.

FIGS. 2, 3 and 4 illustrate examples of computer system configurations capable of implementing the disclosed embodiments. More specifically, FIG. 2 illustrates a computer configuration 200 that focuses on an enhanced ECC feature 216 of the disclosed embodiments. The computer configuration 200 includes a server 204 in I/O communication with a flash controller 206 having an ECC processing unit 208 and an extended or enhanced ECC processing unit 210. Flash controller 206 is the part of a solid state flash memory 212 that houses data and accepts standard ECC scheme(s) 214 and extended ECC scheme(s) 216. Flash controller 206 communicates with server 204 and manages the flash file system directory (not shown). Flash controller 206 is also responsible for wear leveling, error correction and garbage collection.

FIG. 3 illustrates another computer configuration 200a that focuses on the read scrub frequency features of the disclosed embodiments. Computer configuration 200a includes a storage system 302 having an I/O controller in I/O communication with a server (for example, server 204 shown in FIG. 2). A system management module 306 includes a temperature monitor 308, along with additional functionality represented by submodule 310. Submodule 310 manages a variety of system features including RAID functionality, NTP pings (e.g., real time time stamps), and other functionality. Various SSD (solid state device) modules 312, 312a and 312b are in communication with I/O controller 304 and system management module 306. Each SSD module 312, 312a and 312b includes a flash controller 314, 314a and 314b and flash storage 316, 316a and 316b.

FIG. 4 illustrates still another computer configuration 200b that focuses on the read scrub frequency features of the disclosed embodiments. The computer configuration 200b includes a storage system 302a having an enterprise module 306a that provides a variety of enterprise functions including I/O controller functionality, system/array controller functionality, NTP pings (e.g., real time time stamps), and other functionality. Various flash SSD modules 402, 402a are in communication with enterprise module 306a. Each flash SSD module 402, 402a includes a flash controller 314c, 314d, a temperature monitor 308a, 308b and flash storage 316c, 316d.

For ease of explanation, the operation of the computer configurations 200, 200a, 200b will now be provided with reference to configuration 200a and SSD 312 shown in FIG. 3. However the following discussion applies equally to the computer configurations 200, 200a, 200b shown in FIGS. 2 and 4. Flash controller 314 runs a data scrub background process that keeps track of issuing and processing outstanding flash scrub reads for any one or all flash pages. For purposes of this disclosure, it is assumed that a page represents a basic unit of flash storage 316. The scrub read process runs linearly across all valid flash pages (containing user data, RAID protection, meta data, etc.) and issues periodic flash scrub commands to sequential flash pages. The frequency of these scrub commands may be described as DATA_RET_TIME=function (AVERAGE_PE_CYCLE, CURRENT_SYS_TEMP); and TIME_BETWEEN_SCRUB_COMMANDS=DATA_RET_TIME/NUM_FLASH_PAGES. As will be described later in this disclosure in connection with the description of FIGS. 5, 6a and 6b, the DATA_RET_TIME function is derived from actual characterization data of the particular type of flash storage 316 developed during the overall system design process by testing and evaluating a representative sample of the particular type of flash storage used. Thus, DATA_RET_TIME will vary based on the particular manufacturer and type of flash storage 316 used in the design, thereby providing a much more accurate DATA_RET_TIME function. Flash controller 314 receives a periodic NTP ping (or some form of real time, time stamp) and maintains this as an official system time. During a shutdown procedure, system management 306 issues an official system shutdown time ping to flash controller 314, which flash controller 314 uses to overwrite the last system time. During a power loss scenario, flash controller 314 now has a relatively accurate "shutdown time" which was maintained and stored from a previous NTP ping. At system power-on, flash controller 314 receives a new time ping, which flash controller 314 uses to accurately determine how long flash controller 314 and SSD 312 has been powered down, i.e., POWEROFF_TIME.

Flash controller 314 could either use a "worst case" temperature (i.e., the maximum temperature for which flash storage 316 is rated), or use a more accurate temperature reading from temperature monitor 308 in order to determine the temperature of SSD 312 while the system was powered off. Temperature monitor 308 may be implemented as a sensor circuit that runs on minimal power (e.g., built-in, low power batteries) to store the highest temperature recorded or average temperature since last power-off. Temperature monitor 308 could always run and on shutdown, system management 306 could reset the max temperature to zero. Additionally, if temperature monitor 308 detects a high temperature (e.g., a temperature above a predetermined amount) when the system has no external power, system management 306 could have the ability to enable some or all of the system's fans (not shown) using the onboard system batteries (not shown) to facilitate airflow and reduce system temperature. Further, on power-off SSD 312 could remain disabled for some minimum amount of time (e.g., 1 hour) after the system has lost power. In many cases, it is likely that the highest temperature recorded during power-off occurs immediately after shutdown, and allowing an hour or so for the runtime heat to dissipate would provide a more accurate reading of actual power-off temperature. Flash controller 314 then uses this temperature and power-off time for the DATA_RET_TIME calculation: DATA_RET_TIME=function (AVERAGE_PE_CYCLE, MAX_TEMP or ACTUAL_TEMP)–POWEROFF_TIME; and TIME_BETWEEN_SCRUB_COMMANDS=DATA_RET_TIME/NUM_FLASH_PAGES.

On system power-on, if the TIME_BETWEEN_SCRUB_COMMANDS is less than the time it takes to issue and complete a single scrub operation, flash controller 314 may implement a "turbo scrub" wherein host access is locked out while flash controller 314 makes every attempt at scrubbing and correcting all data prior to any host reads. The system may remain offline in an effort to issue and finish the "turbo scrub" as quickly as possible, unless explicitly cancelled and brought online by the user. If an uncorrectable error is detected, SSD module 312 should remain offline and potentially rebuilt depending on the capabilities of the overall system.

Thus, after a power outage/loss, a read scrub process may be engaged immediately upon restoration of power. An extended or enhanced ECC scheme is applied to the initial scrub after power loss based on a duration of the power outage/loss and on the number of program/erase cycles to protect against potential lost capacity that may be induced by an increased level of block retirement if the original, reduced ECC capability is applied. The appropriate level of enhanced ECC applied upon power up is determined based on an input matrix (e.g., tables 600, 600a of FIGS. 6a and 6b) established from device characterization results. Additionally, for a read scrub process engaged upon restoration of power, the duration of the power loss and the number of program/erase cycles can be determined. A worst case temperature may be assumed in conjunction with the duration of the power loss and the number of program/erase cycles to assign an effective read scrub frequency. With the application of a temperature sensor (e.g., temperature monitor 308), an actual average temperature can be determined for the power loss duration, and as a result an optimized and more appropriate read scrub frequency that impacts performance less can be selected. The selection of an appropriate read scrub frequency vs. average temperature can be determined from an input matrix (e.g., tables 600 and 600a) established from the device characterization results developed for a particular manufacturer and type of flash storage used in the design, and that was developed through testing and targeted measurements made during the overall system design process.

Figure 5:
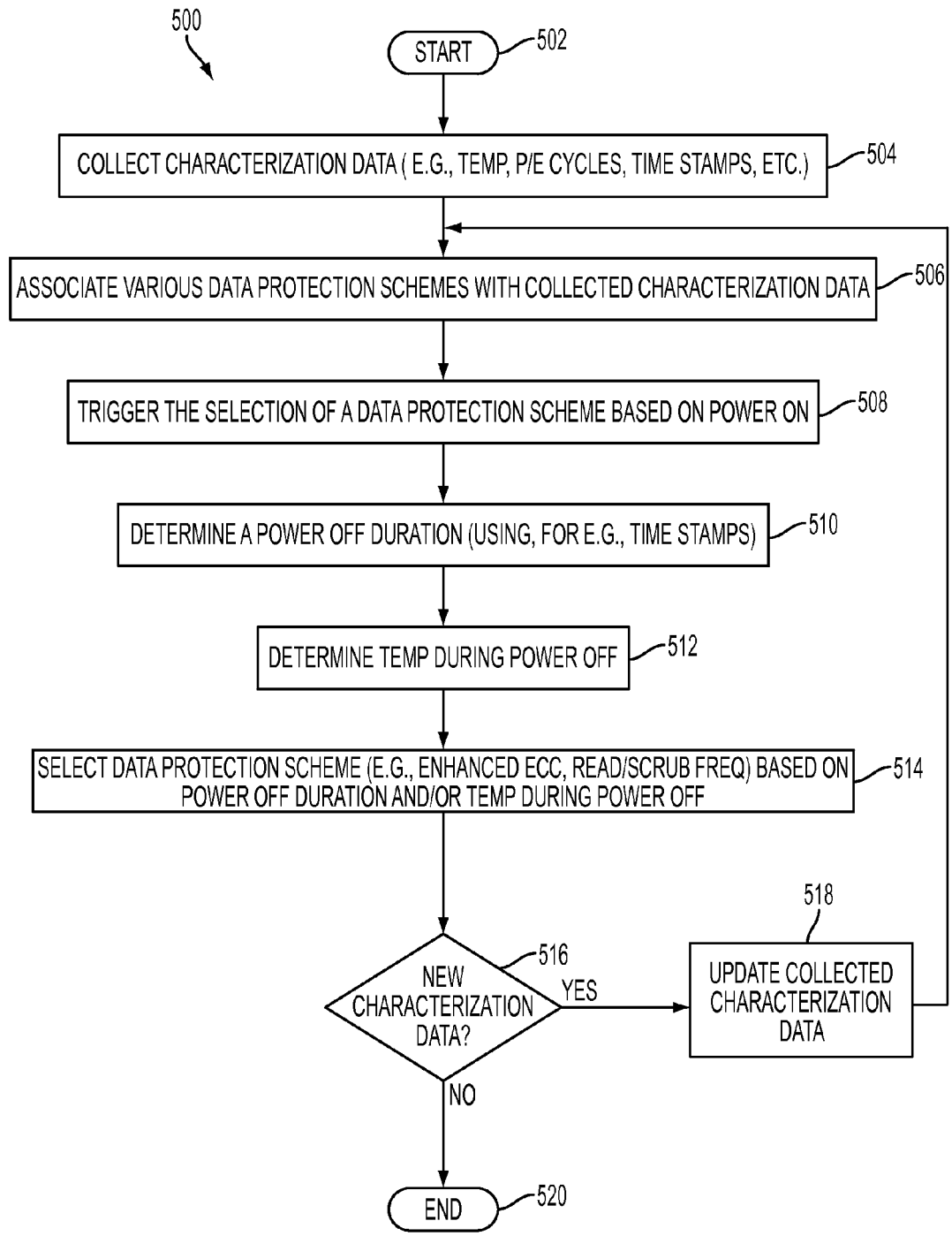
FIG. 5 is a flow diagram illustrating an example of a methodology according to the disclosed embodiments.

FIG. 5 is a flow diagram illustrating a methodology 500 according to the disclosed embodiments. Methodology 500 is described in terms of actions to be performed by, for example, elements of a computing device (e.g., the computer configurations 200, 200a, 200b shown in FIGS. 2-4). Although methodology 500 may be implemented by the computer configurations 200, 200a and 200b shown in FIGS. 2-4, the illustrated computer configurations are merely examples, and a wide variety of computer configurations are within the scope of this disclosure. For example, in FIG. 2, flash controller 206, flash memory/data 212, ECC 214 and extended ECC 216 may be integrated within server 204 or provided as a separate unit. It will be recognized that various operations of methodology 500 may be performed by specific circuits (e.g., application specific integrated circuits (ASICs)), by program instructions being executed by one or more processors, or by a combination of both. Additionally, the sequence of actions described herein can be considered to be embodied entirely within any form of computer readable storage medium having stored therein a corresponding set of computer instructions that upon execution would cause an associated processor to perform the functionality described herein. Thus, the various aspects of methodology 500 may be embodied in a number of different forms, all of which have been contemplated to be within the scope of the claimed subject matter.

Referring to FIG. 5, methodology 500 starts at block 502 then moves to block 504 and collects characterization data, which may include a plurality of parameters of the flash storage 316, 316a, 316b, 316c, 316d (shown in FIGS. 3 and 4). The parameters may include program/erase cycles, temperature, time stamps, power outage duration, and other characteristics. Block 506 then associates various data protection schemes with one or more of the plurality of parameters. The data protection schemes may include a range of read/scrub frequencies, various levels of an enhanced ECC schemes, and other protection schemes. Two tables 600, 600a, shown in FIGS. 6a and 6b, illustrate an example of the associating operation of block 506. For example, reading across the top row of table 600, an enhanced ECC scheme having a correction strength of "1" may be associated with power outage duration of "A" and a remaining program/erase value of "W." Tables 600, 600a of FIGS. 6a and 6b are described in more detail later in this disclosure.

Continuing with a description of methodology 500 of FIG. 5, one of the characterization data parameters collected at block 504 is a power outage duration, which is generally a time period during which power may be removed from the flash storage 316, 316a, 316b, 316c or 316d (shown in FIGS. 3 and 4). Block 508 triggers the initiation of a selection of a data protection when power is restored to the flash storage 316, 316a, 316b, 316c or 316d. Blocks 510 and 512 then collects actual measurements of actual in-use performance parameters of the flash storage 316, 316a, 316b, 316c or 316d. Block 510 determines a power-off duration, which may be calculated by storing real time time stamps of the computer configuration (100, 200 or 200a of FIGS. 2, 3 and 4, respectively) when power is removed from the flash storage 316, 316a, 316b, 316c or 316d (shown in FIGS. 3 and 4). Block 512 determines a temperature, which may be an average temperature, of the flash storage 316, 316a, 316b, 316c or 316d (shown in FIGS. 3 and 4) for the duration of the power outage. Block 512 may utilize the temperature monitor 308, 308a and 308b (shown in FIGS. 3 and 4) to sense the relevant temperature during the power outage. Block 514 then uses the power-off duration measured in block 510 and the temperature during the power outage measured in block 512 to select the appropriate data protection for those measurements. Reference is again made to FIGS. 6a and 6b for an example of how block 514 may be implemented. If for example block 510 measures an actual power outage duration of "D," and the minimum flash endurance remaining is determined to be "Z," tables 600 and 600a would lead to the selection of a data protection scheme comprising an enhanced ECC scheme having correction strength of "4" and a read scrub frequency of "4." It should be noted that methodology 500 may be implemented using either one, or both, of blocks 510 and 512.

Decision block 516 and block 518 are optional, and may be included to provide a mechanism for dynamically changing/updating the characterization data of block 504. Decision block 518 determines whether there is any new characterization data available. If the result of the inquiry at decision block 518 is no, methodology 500 proceeds to block 520 and ends. If the result of the inquiry at decision block 518 is yes, methodology 500 proceeds to block 518, updates the collected characterization data then returns to block 506. Block 518 may be implemented in a variety of ways. For example, where the updated collection data is generated outside of the computer configuration 200, 200a or 200b (shown in FIGS. 2, 3 and 4), block 518 may be implemented as a firmware update containing new characterization data. Alternatively, where the updated collection data is generated by the computer configuration 200, 200a or 200b (shown in FIGS. 2, 3 and 4), block 518 may dynamically update the characterization data based on actual parameters developed during operation of the flash storage 316, 316a, 316b, 316c or 316d (shown in FIGS. 3 and 4). Decision blocks 516 and 518 may also be utilized in the methodology 700, which is shown in FIG. 7 and described in more detail later in this disclosure.

FIGS. 6a and 6b illustrate examples of tables 600, 600a that may be used to dynamically select and/or adjust a data protection scheme for a storage system in accordance with the disclosed embodiments. The tables 600, 600a may be developed during the overall system development process as part of the overall system design. Computer configurations 200, 200a, 200b (shown in FIGS. 2, 3 and 4) may be designed to include different commercial models and/or brands of flash storage 316, 316a, 316b, 316c or 316d (shown in FIGS. 3 and 4) having different actual performance parameters. A version of table 600 and a version of table 600a may be developed for, and applied to, every commercial model and/or brand of flash storage used in the overall system design. As a hypothetical example, where the computer configuration uses several model "ABC" 2×nm MLC (multi-level cell) flash storage manufactured by the "FLASH" company, a representative sample of this model/brand of flash storage systems may be tested and characterization data gathered during the system development and design process. Using the collected characterization data comprising a plurality of performance parameters/data, tables having the format of tables 600 and 600a could be generated and populated with actual configuration data generated from testing the representative samples of the model "ABC" 2×nm MLC flash storage manufactured by the "FLASH" company. Thus, for a system that includes "XX" different types of flash memory, two tables, 600 and 600a may be developed for, and applied to, each type of flash memory, resulting in "XX" multiplied by 2 total tables (600, 600a) in the final system design. Of course the specific format and layout of tables 600, 600a are examples, and a wide variety of characterization data and performance parameters may be used to develop a wide variety of formats for the tables 600, 600a.

Figure 7:
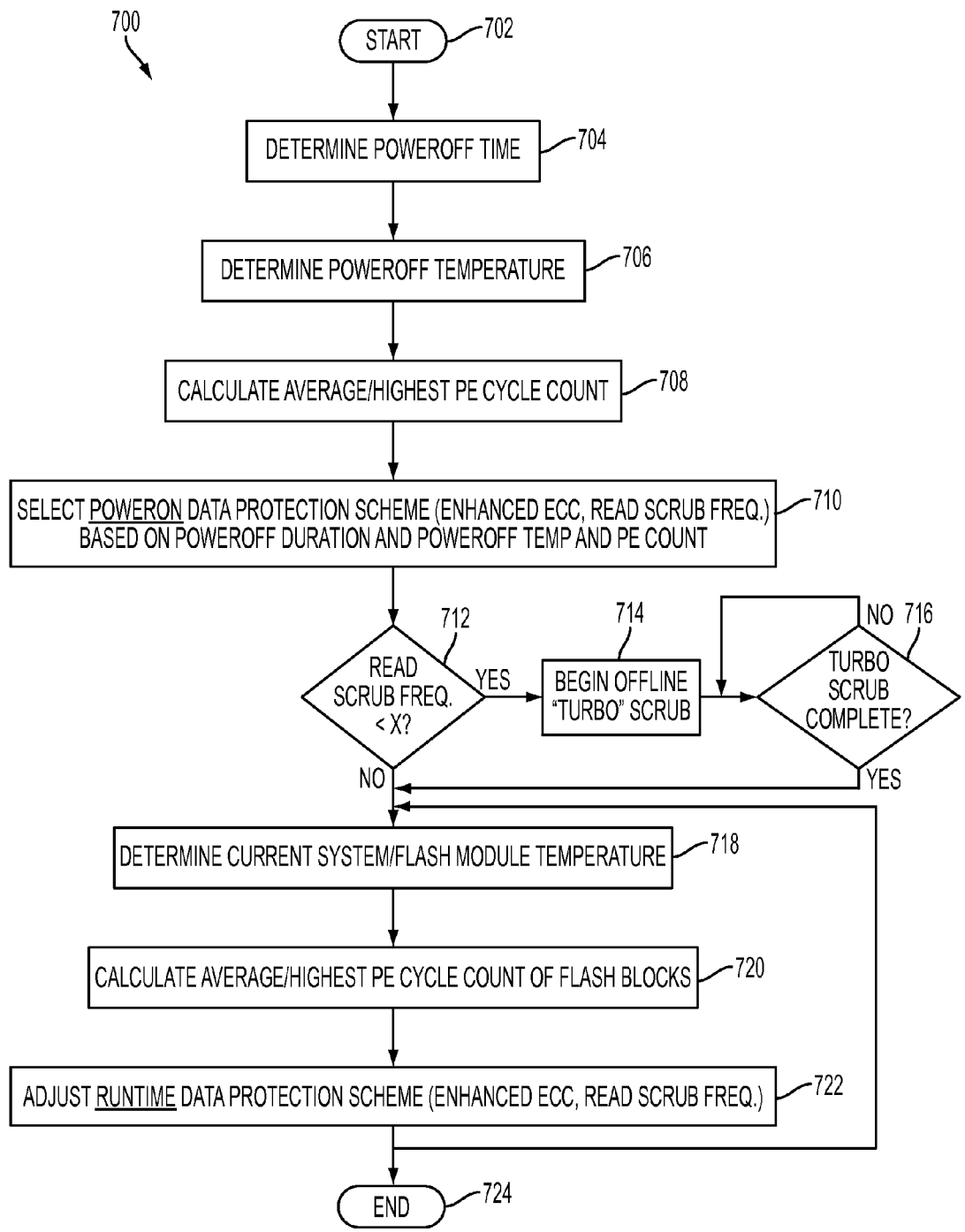
FIG. 7 is another flow diagram illustrating an example of a methodology according to the disclosed embodiments.

FIG. 7 is another flow diagram illustrating an example of a methodology 700 according to the disclosed embodiments. Methodology 500 starts at block 702 then moves to block 704 and determines the power-off time. Block 706 determines the power-off temperature, and block 708 calculates the average and/or highest P/E cycle count. Block 710 selects the power-on data protection scheme (e.g., enhanced ECC, read/scrub frequency) based on power-off duration, power-off temperature and P/E count (e.g., tables 600, 600a in FIGS. 6a and 6b). Decision block 712 then determines whether the read/scrub frequency is less than a predetermined value, "X," for example, where the time between scrub commands is less than the time ("X") it takes to issue and complete a single scrub operation. If the answer to the inquiry at decision block 712 is yes, methodology 700 assumes it needs a "turbo scrub" where host access may be locked out while methodology 700 makes every attempt at scrubbing and correcting all data prior to any host reads. Thus, methodology 700 proceeds to block 714 and decision block 716 to execute a turbo scrub process. Block 714 begins the turbo scrub process, and decision block 716 evaluates whether turbo scrub is complete.

Continuing with a description of methodology 700 of FIG. 7, if the result of the inquiry at decision block 712 is no, or if the result of the inquiry at decision block 716 is yes, methodology 700 moves to block 718 and determines the current system/flash module temperature. Methodology 700 then moves to block 720 and calculates the average/highest P/E cycle count of the flash blocks. Methodology 700 then moves to block 722 and adjusts the runtime data protection scheme (enhanced ECC, read/scrub frequency). Optionally, methodology 700 either ends at block 724 or loops back to block 718 and determines the current system/flash module temperature.

The disclosed embodiments have been described with reference to the drawings. However, the scope of this disclosure is not limited to the disclosed embodiments. Without departing from the scope of the present disclosure, the disclosed embodiments may be implemented by making a variety of improvements, corrections, and modifications to the disclosed embodiments on the basis of knowledge that persons skilled in the art have.

The word "example" is used herein to mean "serving as an instance or illustration." Any embodiment described herein as an "example" is not necessarily to be construed as preferred or advantageous over other embodiments. Likewise, the term "embodiments" does not require that all embodiments include the discussed feature, advantage or mode of operation.

The terms "comprises," "comprising," "includes" and/or "including", when used herein, specify the presence of stated features, integers, operations, elements, and/or components, but do not preclude the presence or addition of one or more other features, integers, operations, elements, components, and/or groups thereof.

Further, many embodiments are described in terms of sequences of actions to be performed by, for example, elements of a computing device. It will be recognized that various actions described herein can be performed in a varying sequence, and the particular order of the disclosed actions may be rearranged where appropriate without departing from the scope of the claimed subject matter.

What is claimed is:

1. A computer implemented method of selecting data protection for a storage device, the method comprising:
    storing data in the storage device;
    determining a data protection scheme based on characterization data that is specific to the storage device and at least one measured parameter;
    wherein the characterization data that is specific to the storage device comprises actual performance data of the storage device developed by testing representative samples of the storage device as part of a design process of a storage system in which the storage device is operated; and
    applying said data protection scheme to said data.

2. The method of claim 1 wherein said at least one measured parameter comprises a power-off duration.

3. The method of claim 2 wherein said at least one measured parameter comprises at least one temperature measured during said power-off duration.

4. The method of claim 1 wherein said at least one measured parameter comprises program/erase cycles.

5. The method of claim 1 wherein the storage system comprises an electrically rewritable NAND nonvolatile random access memory.

6. The method of claim 1 wherein said data protection scheme comprises an enhanced error correcting code (ECC) scheme.

7. The method of claim 1 further wherein:
    said data protection scheme comprises a data scrub frequency; and
    said method further comprises implementing a turbo scrub if said data scrub frequency is below a threshold.

8. The method of claim 1 wherein:
    the storage device comprises a specific type of storage device.

9. The method of claim 8 further comprising using a lookup table that associates various data protection schemes with the actual performance data of the specific type of storage device to determine the data protection scheme.

10. The method of claim 1 further comprising:
    determining that new actual performance data of the storage device is available; and
    updating the actual performance data of the storage device based on the new actual performance data of the storage device.

11. A system for selecting data protection for a storage system, the system comprising:
    a computer system having a processor, the computer system configured to perform a method comprising:
    storing data in the storage device;
    determining a data protection scheme based on characterization data that is specific to the storage device and at least one measured parameter;
    wherein the characterization data that is specific to the storage device comprises actual performance data of the storage device developed by testing representative samples of the storage device as part of a design process of a storage system in which the storage device is operated; and
    applying said data protection scheme to said data.

12. The system of claim 11 wherein said at least one measured parameter comprises a power-off duration.

13. The system of claim 12 wherein said at least one measured parameter comprises at least one temperature measured during said power-off duration.

14. The system of claim 11 wherein said at least one measured parameter comprises program/erase cycles.

15. The system of claim 11 wherein the storage system comprises an electrically rewritable NAND nonvolatile random access memory.

16. The system of claim 11 wherein said data protection scheme comprises an enhanced error correcting code (ECC) scheme.

17. The system of claim 11 further wherein:
    said data protection scheme comprises a data scrub frequency; and
    said system further comprises implementing a turbo scrub if said data scrub frequency is below a threshold.

18. The system of claim 11 wherein:
    the storage device comprises a specific type of storage device.

19. The system of claim 18 further comprising using a look-up table that associates various data protection schemes with the actual performance data of the specific type of storage device to determine the data protection scheme.

20. The system of claim 11 further comprising:
    determining that new actual performance data of the storage device is available; and
    updating actual performance data based on the new actual performance data of the storage device.

* * * * *